(12) United States Patent
Upasani et al.

(10) Patent No.: US 7,581,965 B1
(45) Date of Patent: Sep. 1, 2009

(54) BOTTOM ENTRY INTERCONNECTION ELEMENT FOR CONNECTING COMPONENTS TO A CIRCUIT BOARD

(75) Inventors: Sanjay Sudhakar Upasani, Manalapan, NJ (US); Sebsibe Kebede, Lopatcong, NJ (US); Richard William Brown, Grove City, OH (US); Scott Allen Bergman, Groveport, OH (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 12/113,285

(22) Filed: May 1, 2008

(51) Int. Cl.
   *H01R 12/00* (2006.01)
(52) U.S. Cl. ............... 439/82; 439/857; 439/885
(58) Field of Classification Search ........... 439/82, 439/682, 751, 857, 876, 885
   See application file for complete search history.

(56) References Cited

U.S. PATENT DOCUMENTS

| | | | |
|---|---|---|---|
| 2,869,040 A | 1/1959 | Pifer | |
| 2,968,780 A | 1/1961 | Roswell | |
| 2,972,727 A | 2/1961 | Flanagan, Jr. et al. | |
| 2,973,499 A | 2/1961 | Hammell | |
| 3,008,112 A | 11/1961 | Swengel | |
| 3,696,323 A | 10/1972 | Kinkaid et al. | |
| 3,718,895 A | 2/1973 | Reynolds et al. | |
| 3,824,557 A | 7/1974 | Mallon | |
| 3,884,544 A | 5/1975 | Lundergan et al. | |
| 3,902,776 A | 9/1975 | Williams et al. | |
| 3,915,544 A * | 10/1975 | Yurtin | 439/786 |
| 4,076,355 A | 2/1978 | Olsson et al. | |
| 4,083,623 A | 4/1978 | Lynch | |
| 4,089,575 A | 5/1978 | Grabbe | |
| 4,274,696 A | 6/1981 | Long et al. | |
| 4,379,611 A | 4/1983 | Foege et al. | |
| 4,422,128 A | 12/1983 | Zurlinden et al. | |
| 4,550,959 A | 11/1985 | Grabbe et al. | |
| 4,575,167 A | 3/1986 | Minter | |
| 4,645,278 A | 2/1987 | Yevak et al. | |
| 4,682,829 A | 7/1987 | Kunkle et al. | |
| 4,797,110 A | 1/1989 | Ponziani et al. | |
| 4,992,057 A | 2/1991 | Smit | |
| 5,042,146 A | 8/1991 | Watson | |
| 5,064,379 A * | 11/1991 | Ryll et al. | 439/81 |
| 5,131,853 A | 7/1992 | Meyer | |
| 5,154,621 A | 10/1992 | Legrady | |

(Continued)

FOREIGN PATENT DOCUMENTS

FR  2898734  9/2007

*Primary Examiner*—Tho D Ta
(74) *Attorney, Agent, or Firm*—Wood, Herron & Evans LLP

(57) ABSTRACT

An interconnection element for coupling a component with a circuit board having a top side and a bottom side has a planar portion configured to be surface mounted on the top side of the circuit board to overlie an opening in the circuit board. An opening is formed in the planar portion to coincide with the circuit board opening. Opposing spring fingers are coupled to the planar portion, and each spring finger has a gripping leg extending downwardly toward the planar portion. The gripping legs are positioned on opposite sides of the opening in the planar portion and extend through the opening in the planar portion to extend into the board opening and capture a component lead that extends in the board opening from the bottom side of the circuit board.

22 Claims, 4 Drawing Sheets

U.S. PATENT DOCUMENTS

| | | |
|---|---|---|
| 5,433,616 A | 7/1995 | Walden |
| 5,709,574 A | 1/1998 | Bianca et al. |
| 6,051,781 A | 4/2000 | Bianca et al. |
| 6,079,990 A | 6/2000 | Martucci et al. |
| 6,089,880 A * | 7/2000 | Miyagawa et al. ............ 439/82 |
| 6,315,580 B1 | 11/2001 | Hurtubise et al. |
| 6,319,024 B1 | 11/2001 | Daoud |
| 6,319,025 B1 | 11/2001 | Sudo |
| 6,659,784 B1 | 12/2003 | Klein et al. |
| 6,659,812 B2 | 12/2003 | Gessford et al. |
| 6,750,396 B2 | 6/2004 | Roy |
| 7,207,811 B2 | 4/2007 | Xu |

* cited by examiner

BOTTOM ENTRY INTERCONNECTION ELEMENT FOR CONNECTING COMPONENTS TO A CIRCUIT BOARD

FIELD OF THE INVENTION

The present invention relates generally to the issue of coupling multiple circuit elements, components, or modules to a printed circuit board and more specifically to mounting a power converter module or other module to a circuit board.

BACKGROUND OF THE INVENTION

The circuit components and modules for various electronic systems, such as, for example, telecommunication systems and equipment, are often arranged and housed in the form of one or more printed circuit boards. The multiple electronic components or modules are mounted on the board, and conductive traces or patterns operably connect the components together. For example, the motherboard of an RF power amplifier, as used in telecommunication applications, will contain not only individual circuit components, but also must support one or more larger power converter modules for various power requirements on the motherboard. One particular constraint in system design and manufacturing of such boards is the amount of space that each board has to handle the various components and modules. Additionally, a simpler mechanical/physical design is realized when the power module is mounted to the bottom side (versus top side) since it is easier to mate to a heat sink (for purposes of necessary heat dissipation from the power module).

To maximize the amount of available surface area of a printed circuit board on the top component side of the board, or to address certain mechanical design constraints that are due to product size requirements, various larger circuit components are often attached to the bottom side of the circuit board. For example, the power converter modules for a system are often mounted on the bottom side. In that arrangement, the through-hole leads or pins for the power converter module protrude from the bottom of the board up to the top side of the board. This arrangement often leads to difficulties and inefficiencies in board fabrication and manufacturing and thus can lead to higher costs.

Specifically, the primary existing method to connect bottom side power converter module leads to a circuit board is by manual/hand soldering. FIG. 1 illustrates a circuit board 10, with a bottom side power converter module 12, coupled thereto by soldering 13. The hand soldering is very difficult due to the large mass presented by the leads 14 of the power converter module 12, as well as the extensive external and internal power planes that typically exist on the circuit board 10. For example, there may be as many as 16 leads that require hand soldering for a "full brick" power converter module 12. Special automated methods of solder attachment are also available for bottom side power converter attachment, including robotic soldering and selective wave machines. However, these machines are not standard equipment items in board manufacturing shops and rework/repair facilities, are very high capital expense items, and still experience similar solder difficulties as manual soldering due to the large mass of leads and extensive power planes on the circuit board.

This problem is further compounded by the fact that the power converter module has internal solder connections that are at risk of solder re-reflow, and subsequent damage, when the external leads 14 are manually soldered to the circuit board. As a result, the risk of internal damage requires each power converter module manufacturer to stipulate strict manual solder parameters (e.g., temperature and solder iron dwell time applied to each lead). Such parameters are extremely difficult to adhere to.

Still further, the recent introduction of lead-free solder alloys (RoHS regulations) results in still greater difficulty with manual soldering. This is because lead-free solders have much higher melting temperatures than traditional lead-based alloys and thus do not "wet" as easily. Furthermore, the periodic need to remove a soldered power converter module (such as for rework or repair) is extremely difficult, and often results in irreparable damage to the circuit board and/or the module.

Consequently, a socket interconnect approach is desirable as a means of coupling the power converter module to and from the circuit board assembly without the need for manual or special automated soldering.

However, the existing and commercially available through-hole socket arrangements and components have significant drawbacks. For example, various off-the-shelf power sockets are configured for a "top-entry" design. Therefore, for components, such as the power converter modules 12, that are mounted to the bottom side (as shown in FIG. 1) the socket must also be attached to the bottom side of the circuit board 10. This bottom side manufacturing scenario always requires special assembly processes for the attachment of the socket to the circuit board. Therefore, hand soldering is necessary. Alternatively, an extra pass through the reflow oven might be required. Such extra assembly processes or manual processes inevitably result in higher assembly costs and/or inferior attachment quality (including inferior long-term reliability) of the components or modules to the board.

A further complication is that many commercially available off-the-shelf power sockets that have a discrete design are not suitable for the vacuum pickup that is used in automated pick-and-place techniques using standard surface-mount assembly equipment. Therefore, the power sockets require either special assembly processes or hand placement. A special assembly process requires special automated insertion equipment, such as odd-form placement equipment, with grippers. This results in additional capital costs. Hand placement, on the other hand, is inferior in both cost and quality, as compared to viable automated placement alternatives.

Existing, discrete power sockets also have very stringent positional tolerance requirements in order to mate properly with a multi-pin power converter module. Such tolerance requirements mandate a circuit board with a physical design that has very tight mounting hole clearances. The tolerance requirements make it infeasible to use automated insertion techniques with standard assembly equipment. This further dictates that manual placement be used, resulting in higher assembly costs. Additionally, the reliability of the solder joint is compromised, per electronics industry end point requirements, because the tight clearance between the socket and board hole does not provide sufficient space for the proper flow of solder. These sockets do not have ability to properly mate and provide proper contact force for pins of power converters which have high positional tolerance.

Non-discrete power sockets, which may include a "ganged" design of discrete sockets, utilize a plastic, molded carrier to simultaneously insert all sockets. The ganged design permits the use of standard automated surface-mounting equipment. However, such sockets are still a top entry design. Therefore, they also require bottom side attachment and hand soldering, or an extra pass through the reflow oven, as noted above. Additionally, this ganged approach is cost prohibitive for small to moderate volumes of different power converter module designs that have different pin arrangements. This is because hard tooling is required for the plastic carrier, and separate inventories are required for each different part type.

Accordingly, there is still a need in the industry for an apparatus and method to readily and cost-effectively mount components, such as power converter modules, to the bottom of a circuit board. There is further a need to reduce the time and damage issues associated with manual placement and manual soldering. There is still further a need in the art to address the various drawbacks noted above for existing attachment components and manufacturing techniques. There is still a need for a socket physical design that permits attachment to the top side of the board, while allowing for insertion of the power converter module from the bottom side of the board (a "bottom-entry" connection).

SUMMARY OF THE INVENTION

An interconnection element for coupling a component with a circuit board having a top side and a bottom side includes a planar portion that is configured to be surface mounted on the top side of the circuit board. The planar portion overlies an opening in the circuit board that extends between the top and bottom sides of the board. An opening is formed in the planar portion to coincide with the board opening. Opposing spring fingers are coupled to the planar portion and each spring finger has a support leg extending upwardly from the planar portion and a gripping leg extending downwardly toward the planar portion. The gripping legs of the opposing spring fingers are positioned on opposite sides of the opening in the planar portion and are configured to grip a component lead that extends in the board opening from the bottom side of the circuit board. The gripping leg of each spring finger extends through the opening in the planar portion to extend into the board opening and capture the lead below the top side of the circuit board

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION OF EMBODIMENTS OF THE INVENTION

The present invention can address various drawbacks in the prior art as noted above, and provides an interconnection element or socket to couple a component to a circuit board. It provides a robust mechanical and electrical connection between a circuit board and one or more components or modules, such as a power converter module. The interconnection element provides both surface-mount technology (SMT) and through-hole attachment techniques, thus, providing a robust physical attachment as well as a robust electrical connection between the board and component. The interconnection elements are discrete to adapt to various different component lead or pin arrangements, and do not require precise pin alignment with the interconnection element.

The present invention provides a top side interconnection element that is configured to receive pins or leads from components inserted on the bottom side of a circuit board. The invention is configured for automated surface-mount technology placement and fixation, and eliminates the need for hand soldering. Standard stencil printing methods can be used to provide repeatable application of solder volume on the circuit board before mounting. The present invention is not only effectively and efficiently positioned and secured, but also may be readily extracted for re-work, repair or replacement of a component on the circuit board, such as a power converter module. Damage to both the component and the circuit board is minimized because of the elimination of a de-soldering and re-soldering process.

Figure 2:
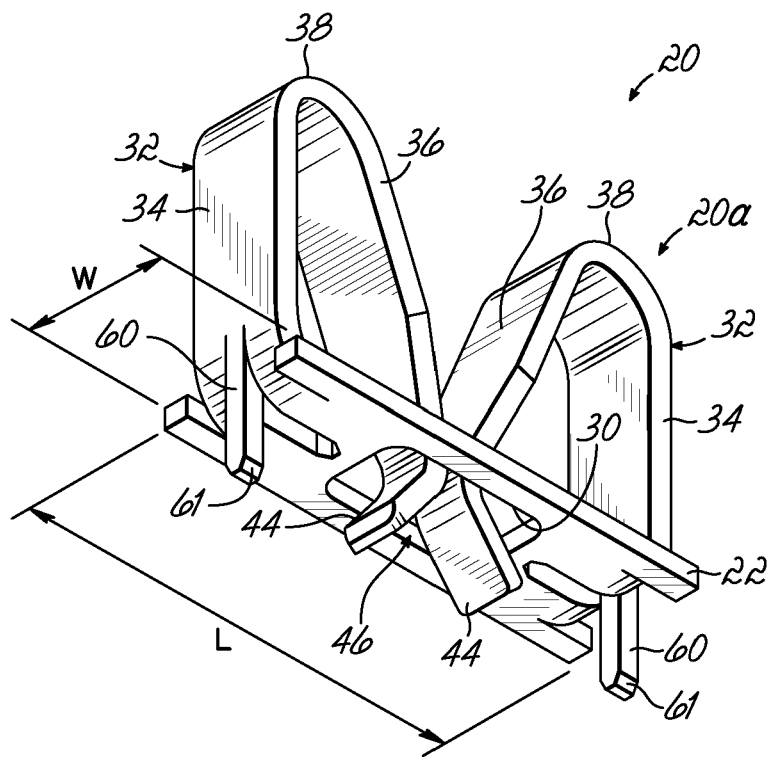
FIG. 2 is a perspective view of an interconnection element, in accordance with one embodiment of the invention.
Figure 3:
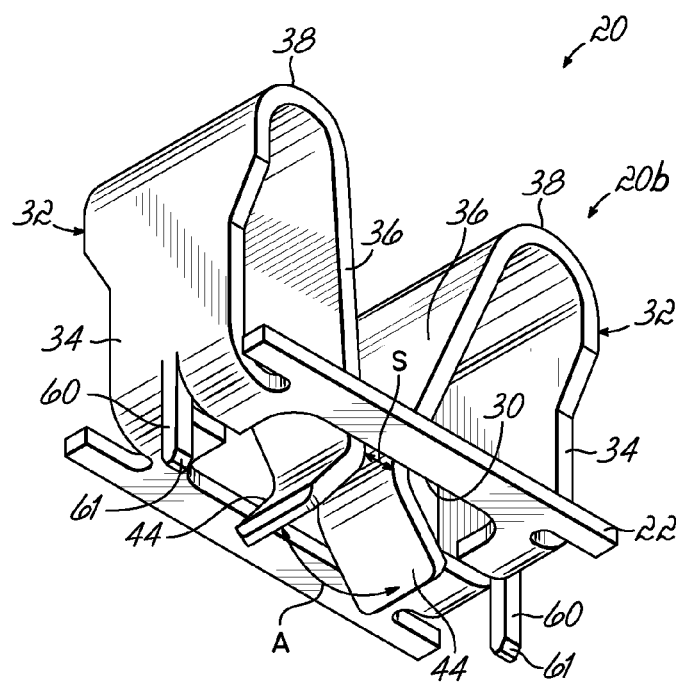
FIG. 3 is a perspective view of an interconnection element, in accordance with an alternative embodiment of the invention.

Turning now to FIGS. 2 and 3, perspective views of various embodiments of the interconnection element of the invention are illustrated. Such an interconnection element is also often referred to as a socket, and specifically might be considered the female version of the socket to receive the male version in the form of a pin or lead from an electrical component, such as a power converter module, that is plugged into the socket. For terminology consistency throughout the application, the element 20 herein is referred to as an interconnection element.

Figure 1:
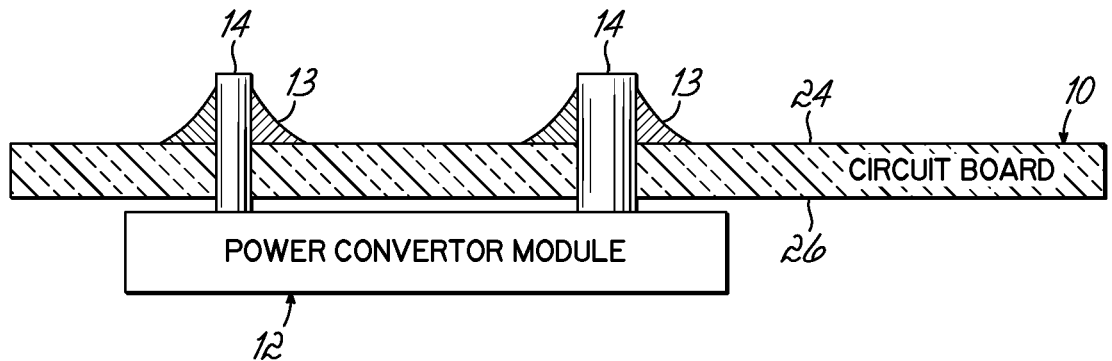
FIG. 1 illustrates a prior art circuit board, with a power converter module that is hand soldered.
Figure 4:
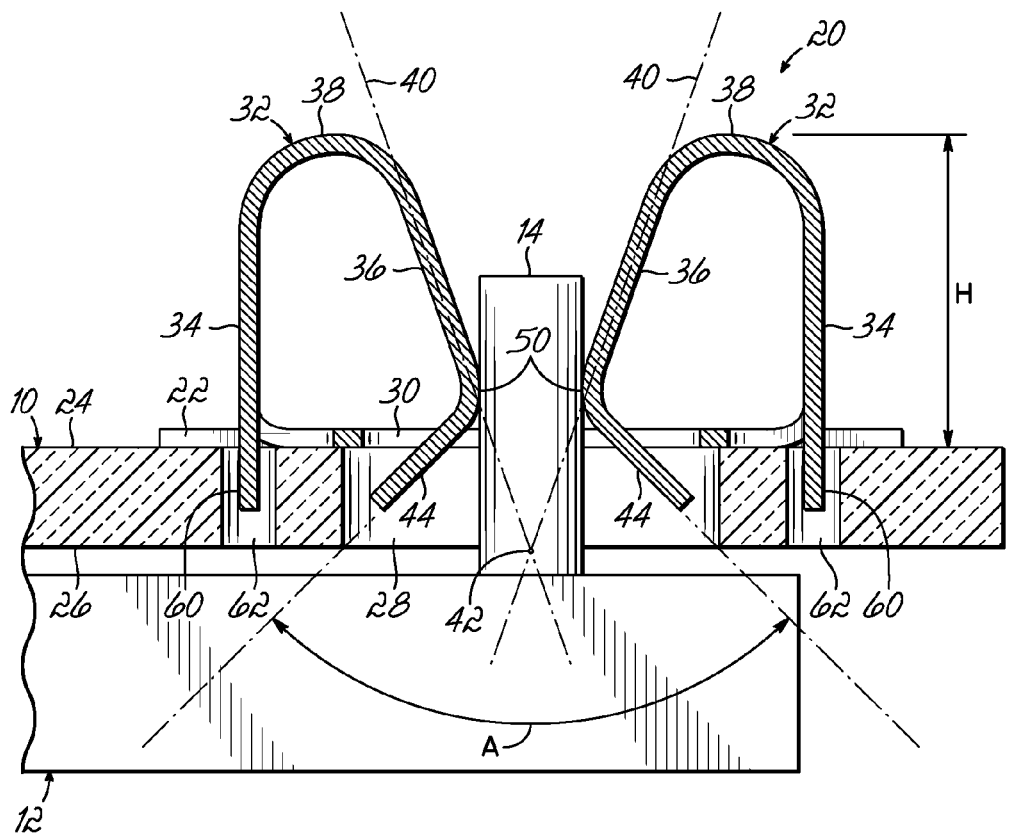
FIG. 4 is a cut-away side view, in partial cross-section, illustrating use of the invention to connect a component with a circuit board.
Figure 5:
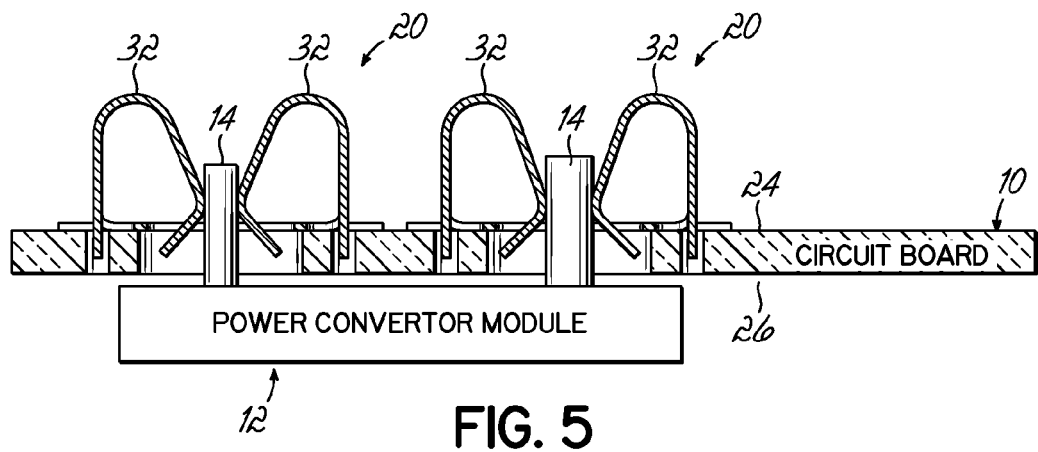
FIG. 5 is a cut-away side view of a circuit board utilizing the present invention for coupling components thereto.

The interconnection element 20 may be utilized for coupling a component, such as a power converter module 12 as illustrated in FIG. 1, with a circuit board 10. Specifically, interconnection element 20 is configured to be mounted on the top side 24 of a circuit board to then receive a lead or pin from the power converter module 12 mounted on the bottom side 26 of the circuit board 10, as illustrated in FIGS. 4 and 5, and discussed further herein below. Throughout the examples discussed in this application, the component attached to the circuit board is indicated as a power converter module 12, such as a power converter module coupled to the motherboard of an RF power amplifier. However, as will be readily understood, other circuit components can be physically and electrically connected with a circuit board utilizing the present invention. Therefore, the invention is not limited to use with just power modules. However, it should also be noted that the present invention provides a suitable connection for the various power pins of a power converter module, which power connection requires a particularly robust electrical and physical connection.

FIGS. 2 and 3 illustrate alternative embodiments of the invention. FIG. 2 is configured and dimensioned to receive a 0.040" diameter power converter module pin, while the embodiment of FIG. 3 is configured and dimensioned to receive a similar-type pin, having a 0.081" diameter. Such dimensions address a range of popular power converter module pins. Of course, the present invention may be readily scaled and/or dimensioned to address other lead or pin sizes. The embodiments of the interconnection elements 20 are designated as 20a in FIGS. 2 and 20b for the embodiment in FIG. 3. However, as those elements share common design features and constructions, similar reference numerals will be utilized to designate the common sections or portions for each element, as discussed herein.

Referring now to FIG. 2, element 20a includes a planar portion 22, which defines a base for the interconnection element 20a. The planar portion is generally planar or flat and is, thus, configured to be surface-mounted on a side of a flat circuit board. The generally planar portion does not have to be exactly flat or planar for the purposes of the invention. The circuit board sides 24, 26 are designated as a top side 24 or a bottom side 26, but the designation of top and bottom is generally relative. For the purposes of discussing the embodiments of the invention in the application, the top side 24 of the circuit board 10 will be considered to contain the majority of the various surface-mounted electrical components of the circuit board, along with conductive traces and patterns for connecting those elements. The bottom side 26 (see FIGS. 4 and 5) will be considered the side to receive the power converter module 12.

Returning again to FIG. 2, the interconnection element 20a, and specifically the planar portion 22, is surface-mounted on the top side 24 of the circuit board to overlie an opening 28 (FIGS. 4 and 6) that is formed in the circuit board to extend between the top side 24 and the bottom side 26 of the board. As illustrated in FIGS. 4 and 5, the leads 14 of the power converter module 12 extend through the opening 28 from the bottom side 26 to the top side 24 of the board.

An opening 30 is formed in the planar portion 22, and coincides with the board opening 28, when the planar portion is surface-mounted to overlie that opening 28. In that way, lead 14 can extend up through the planar portion 22 of element 20a.

The interconnection element 20 also includes opposing spring fingers 32 on opposite sides of the planar portion 22. As illustrated in the Figures, the spring fingers 32 are essentially mirror images of each other, and thus will share common reference numerals for explanatory purposes. The opposing spring fingers 32 are coupled to the planar portion 22. In the embodiment illustrated in the Figures, the spring fingers are up-struck from a common metal blank utilizing known stamping and shaping metal techniques. Therefore, element 20a is a unitary element in the disclosed embodiment. The spring fingers 32 might also be coupled to the planar portion 22 in another suitable fashion.

In one embodiment of the invention, a suitable metal for forming interconnection elements 20 is a beryllium copper that is tin-plated. The tin plating is utilized to match the tin plating generally found on pins of power converter modules. An underlying coating or finish of nickel (not shown) might be used for adhering the tin to the beryllium copper. The spring fingers 32 are spring-biased toward each other, and are configured to grip a component lead 14 that extends into the board opening 28, and through opening 30 of the interconnection element, as illustrated in FIGS. 4 and 5. In accordance with one aspect of the present invention, the spring fingers 32 have ends that extend through the opening 30 in the planar portion 22, and extend into the board opening 28 below the board top side 24, in order to engage and grip the lead 14 below the top side 24 of circuit board 10.

More specifically, referring to FIGS. 2 and 3, the opposing spring fingers 32 each include a support leg 34 that extends upwardly from planar portion 22. As noted above, the support leg and other sections of the spring fingers may be struck from a single metal blank, such that the interconnection element is completely formed from a single piece of metal. The support legs 34 extend upwardly from the planar portion 22, and are each coupled to a respective gripping leg 36 that extends down toward the planar portion. A radiused section 38 connects the support leg 34 with the gripping leg 36, and the resiliency of the metal provides the spring action of the spring fingers 32. In that way, each of the spring fingers is generally in the form of an inverted U-shaped or V-shaped element, extending upwardly from planar portion 22.

As illustrated in FIG. 4, the gripping legs of the spring fingers each define an axis 40. The gripping legs are oriented so that the axes of those legs intersect each other at a point 42 that sits below the planar portion 22 and below the top side 24 of board 10. Each gripping leg also extends through opening 30 to extend into the board opening 28, as illustrated, to engage lead 14 below the top side 24 of the circuit board. More specifically, each gripping leg of the spring finger includes a flared section 44 at the end of the spring finger that is angled on an axis away from the opposing gripping leg 36. In that way, the ends of the opposing spring fingers, and particularly the ends of the opposing gripping legs 36, form a flare area 46 to capture and engage the lead 14 as it is inserted up through the circuit board from the bottom side 26 to the top side 24 to engage the interconnection element 20.

In accordance with one aspect of the invention, the end flared sections 44 and the defined flare area 46, which is formed thereby, accommodate various pin or lead alignment discrepancies when the module 12 is mounted. The interconnection element 20a of the invention is more forgiving, and does not require specific and highly-precise pin alignments with the interconnection element 20a. The end flared sections 44 capture the leading tip of the lead 14, and guide it into proper engagement with the spring fingers 32, so that the gripping force providing by the opposing spring fingers is sufficient to provide and maintain a good mechanical connection and excellent electrical connection, as well as to provide and maintain a robust electrical connection, for the purposes of efficient power and heat transfer. Therefore, due to the unique construction of the interconnection element of the invention, it provides a certain amount of self-centering of the spring fingers over a misaligned pin. In one embodiment of the invention, the flared sections 44 of the opposing gripping legs form an angle A (at rest) in the range of 67 to 134 degrees (See FIGS. 3 and 4). In one particular embodiment, the angle A is around 76°.

As illustrated in FIGS. 4 and 5, the end flared sections 44 of the gripping leg that extend through opening 30 and into the board opening 28 to engage the lead below the top side of the circuit board ensure a proper and robust connection, and present a contact area that adapts to a wide variety of lead or pin protrusion lengths. For example, some of the power converter module leads or pins may not significantly penetrate to a position well above the top side 24 of circuit board 10, as illustrated in FIGS. 4 and 5, due to varying circuit board thicknesses 10 or varying z-axis positions of power converter 12 with respect to circuit board 10. Circuit board thicknesses, for example, may be in the range of 0.063-0.093 inches. The present invention, with spring fingers that have ends extending below the effective bottom or base 22 of the interconnection element and into the opening 28 of the circuit board, provides suitable engagement of shorter power pin protrusion lengths for modules mounted on the bottom side of board 10.

Figure 4A:
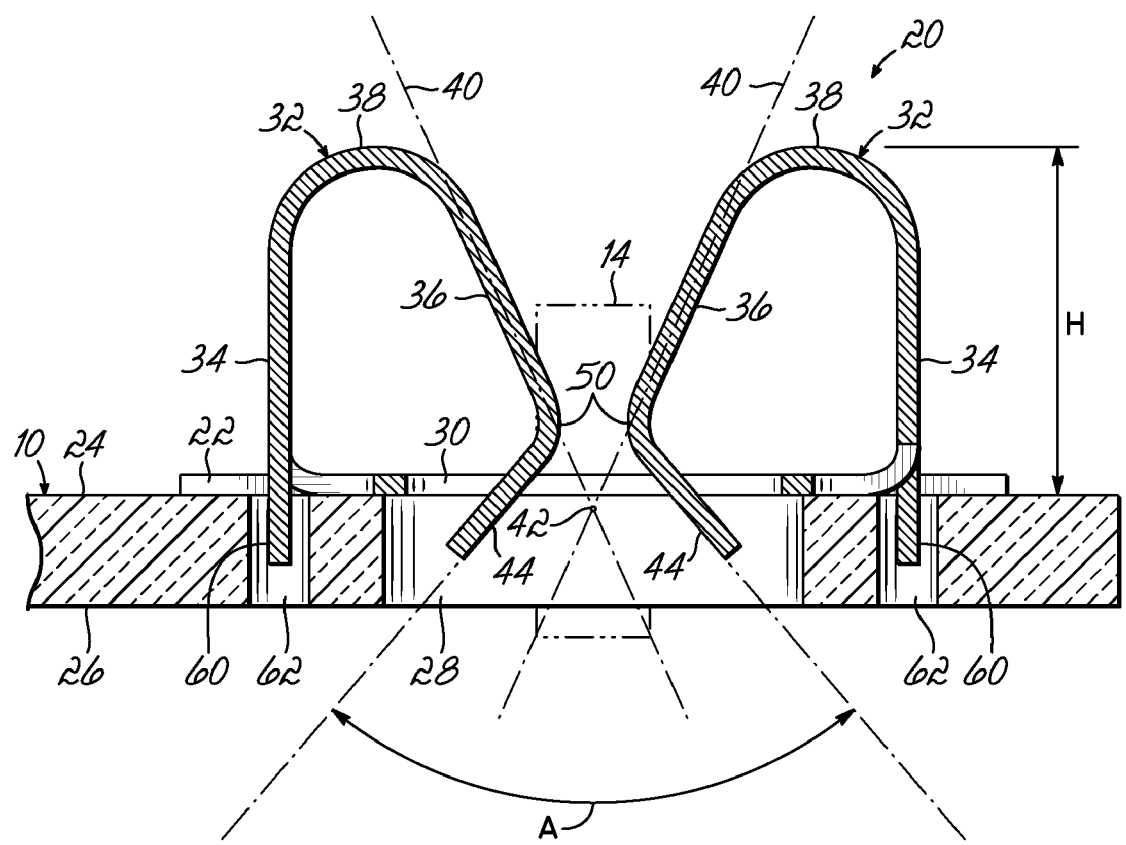
FIG. 4A is a cut-away side view similar to FIG. 4 showing a pin positioned but not inserted.

Furthermore, the extension of the ends of the gripping legs through the center of the opening 30 and into or inside of the circuit board 10 provides for lead insertion at the center of spring fingers/gripping legs, and the center of the contact points 50 of the spring finger with the lead. (See FIG. 4A). This further strengthens the electrical robustness of the connection. This critical feature of presenting the contact area that adapts to a wide variety of lead or pin protrusion lengths is inadequate and unsatisfactory in prior art power sockets.

The present invention provides a discrete interconnection element or socket, which may be utilized to adapt to a variety of different components, and a wide variation of spacing for the individual leads or pins. Furthermore, the present invention is configured for close placement to adapt to closely-spaced leads on a component. In the embodiment of FIG. 2 for a 0.040" pin, the interconnection element 20a has a length L of around 8.6 mm, a width W of 2.79 mm, and an overall height H of around 5.9 mm. Alternatively, the larger embodiment illustrated in FIG. 3, for a 0.081" pin, has a length L of around 9.4 mm, a width W of around 5.33 mm, and an overall height H of around 6.8 mm. Of course, as noted above, the invention might be otherwise dimensioned to address a particular application or pin/lead size. The ability to address close placement and pin spacing, as addressed by the present invention, is inadequate and unsatisfactory in prior art power sockets.

As discussed above, the gripping leg sections 36 include a contact point or elbow 50 at the point where the flared sections 44 are angled away from each of the opposing gripping legs. The spacing S between those elbows (see FIG. 3) is dimensioned to provide suitable gripping of the power converter module lead 14. For example, in the embodiment illustrated in FIG. 2, which is configured to handle a power converter module lead, which is 0.040" in diameter, has a spacing S (at rest) of around 0.25 mm. Alternatively, in the embodiment of the interconnection element 20b illustrated in FIG. 3, the spacing S (at rest) might be around 0.76 mm, as it is configured to handle a power converter module lead having a diameter of approximately 0.081". It will be appreciated that such spacing S will be the smallest when the spring fingers are at rest, and not engaging the lead 14, as shown in FIG. 4. Accordingly, the height H of the support leg 34, the length L of the gripping leg 36, the orientation of the angle of axis 40, and the dimension of the radiused section 38, might all be dimensioned and configured to achieve a particular spacing S and a particular gripping force on the power converter module leads 14. In one embodiment, a gripping force of approximately 1.65 lbs. is desired.

In accordance with another aspect of the present invention, the interconnection element 20 provides a combination of attachment technologies, including both surface-mount technology and through-hole mounting technology. Referring to FIGS. 2 and 3, the interconnection element 20 includes through-hole appendages 60 mounted at either end of the planar portion 22. The through-hole appendages 60 extend downwardly from the planar portion 22, and are configured with tapered ends to consistently and properly engage a through-hole 62 formed in a circuit board 10, as illustrated in FIG. 4. Such appendages may be formed by down struck metal from the metal blank used to form element 20. When the planar portion 22 is surface-mounted to the top side 24 of the circuit board, as illustrated in FIG. 4, the through-hole appendages 60 extend into the respective through-holes 62, and thereby provide an additional mechanical and electrical connection for the interconnection element 20. The dual mounting technology provided by the invention provides not only an additional electrical contact with the circuit board, but also provides an additional physical attachment point, which provides a robust physical attachment of the interconnection element to a circuit board.

Through-hole mounting techniques are generally more physically and electrically robust than surface-mounting technology. The present invention provides both mounting technologies together in a single package. This important and unique combination of features is not addressed in prior art power sockets.

This provides a particular benefit with respect to the physical mounting of power converter modules, especially those mounted from the bottom side of the board, as shown in FIG. 4. When the power converter module is mounted, the various leads or pins are aligned with the board openings 28 and the interconnection elements 20 that overlie those openings. The power converter modules are then pushed toward the backside of the board, so that the leads 14 pass through opening 28 to thereby engage the flared sections 44 of the spring fingers 32, so that the spring fingers spread and engage and grip the lead at contact points 50, as shown in FIG. 4. It may take significant force in order to spread the spring fingers 32, even with the flared sections 44 or a chamfered tip on the lead 14. The dual mounting technology ensures that the interconnection element is held tightly to the circuit board, and does not break away from board 10 due to the applied force of the inserted lead, which pushes the element 20 away from board 10 during initial engagement.

In accordance with another aspect of the present invention, the through-hole appendages 60 provide alignment features for the interconnection element 20, so that it may be aligned properly on the circuit board. Not only is such alignment desirable for initial placement and solder attachment of the interconnection element, but also will be utilized for manual insertion when re-working and re-soldering the interconnection element if it has to be removed from the circuit board for some reason. This assured alignment accuracy of the interconnection element to the circuit board is critical to ensure a proper mechanical and electrical connection from the lead/pin to the interconnection element.

Figure 6:
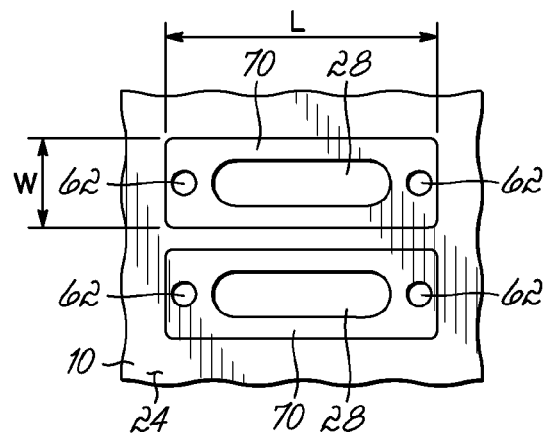
FIG. 6 is a top view of one embodiment of a topside solder pad or footprint pattern on a circuit board for implementing the present invention.

FIG. 6 illustrates a suitable solder pattern or pad configuration 70 for the interconnection element 20 of the invention. The solder patterns 70 on circuit board 10 are illustrated in a generally rectangular shape, although other shapes may be utilized to coincide with the footprint of the interconnection element 20 and planar portion 22. The opening 28 in the circuit board 10 is illustrated and corresponds with a solder-free area in a solder pattern 70. Similarly, a solder-free area is provided at the through-holes 62 formed in the board. Solder pattern 70 includes a large area to receive the planar portion or base 22 of the interconnection element 20, and thus provides suitable surface-mounting of the interconnection element, according to known SMT techniques. As noted above, the appendages 60 are aligned in the respective through-holes 62, and soldered into the through-holes.

Thus, utilizing the present invention, a stenciled print of solder paste may be made according to suitable patterns 70, as illustrated in FIG. 6, for repeatable application of solder volume, to simultaneously mount the planar portion 22 and appendages 60 of the interconnection element. As such, manual or hand soldering of the power converter pins may be eliminated in order to eliminate all the drawbacks and possible damage to circuit components associated with such manual soldering techniques. Oven reflow of the solder paste is utilized for repeatable, quality soldering attachment of the interconnection element. Furthermore, the elimination of difficult manual soldering removes the need to have special training and operator "certification" for the assembly process.

The risk of internal damage to the power converter modules' internal connection is also eliminated as an issue because the leads 14 are not subject to a solder iron.

The present invention also provides a very effective and efficient means for extracting the power converter module for re-work/repair, thus eliminating the risk of circuit board damage (especially for lead-free solder alloys) that is present when de-soldering and re-soldering the power converter module leads. The power converter module may be simply pulled off of the board, with the leads or pins being pulled from their respective interconnection elements on the opposite side of the board.

Referring again to FIG. 6, suitable solder pad pattern 70 might be dimensioned and configured for the specific dimensions of the interconnection element. To that end, a solder pad configuration to utilize the interconnection element 20a, as illustrated in FIG. 2, might have a width W as shown of around 3 mm, and a length L as shown of around 9.3 mm. Similarly, for the interconnection element 20b illustrated in FIG. 3, a solder pattern with a width W of approximately 5.6 mm, and a length L of approximately 9.6 mm might be utilized.

Figure 7:
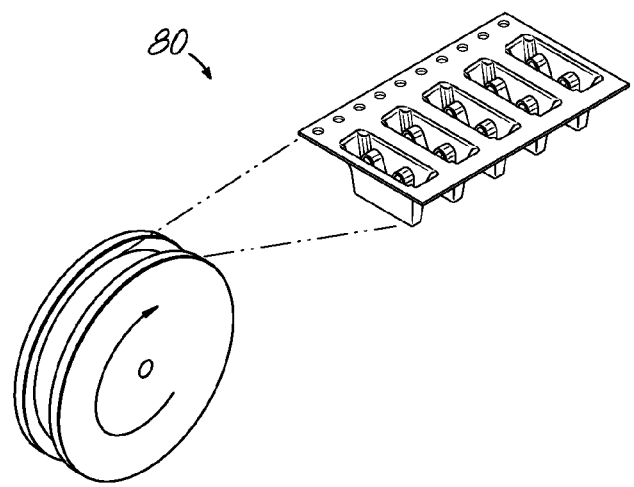
FIG. 7 is a perspective view of a tape-and-reel arrangement for implement the present invention with pick-and-place automated equipment.

The present invention is also suitable for utilization in automated manufacturing. The tops of the spring fingers are suitable for vacuum pickup and placement for use with automated pick-and-place using standard surface-mounted assembly equipment. This is because the interconnection element of the invention is positioned on a top side of the circuit board, rather than on the bottom side, as would be necessary with prior art power sockets. Without the stringent positional tolerance requirements that are required by existing power sockets, utilization of the present invention allows for automated insertion, and eliminates the need for manual placement of the interconnection elements. Referring to FIG. 7 the present invention may, thus, be utilized in a tape-and-reel packaging 80, as shown for use with automated SMT-mounting technology.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. An interconnection element for coupling a component with a circuit board having a top side and a bottom side, the element comprising:
    a planar portion configured to be surface mounted on the top side of the circuit board and overlie an opening in the circuit board that extends between the top and bottom sides of the board, an opening formed in the planar portion to coincide with the board opening;
    opposing spring fingers coupled to the planar portion, each spring finger having a support leg extending upwardly from the planar portion and a gripping leg extending down toward the planar portion, the gripping legs of the opposing spring fingers being positioned on opposite sides of the opening in the planar portion and configured to grip a component lead that extends in the board opening from the bottom side of the circuit board;
    the gripping leg of each spring finger extending through the opening in the planar portion to extend into the board opening and capture the lead below the top side of the circuit board.

2. The interconnection element of claim 1 wherein at least a portion of the flare area is positioned below the planar portion so as to be located in the board opening when the interconnection element is mounted on a circuit board.

3. The interconnection element of claim 1 wherein the spring fingers include a radiused section connecting the support leg and gripping leg to enable the gripping leg to flex against the support leg and grip a component lead.

4. The interconnection element of claim 1 wherein the gripping legs of the spring fingers each define an axis, the gripping legs being oriented so that the axes intersect each other at a point below the planar portion.

5. The interconnection element of claim 4 wherein each gripping leg includes a flared section that is angled away from the opposing gripping leg so that the opposing legs form a flare area to capture a component lead.

6. The interconnection element of claim 5 wherein the flared sections of the opposing gripping legs each define an axis and form an angle between their respective axes in the range of 67 to 134 degrees.

7. The interconnection element of claim 1 further comprising at least one through-hole appendage that extends from the planar portion of the element, the through-hole appendage configured to engage a through-hole in a circuit board when the planar portion is surface mounted to the top side of the board.

8. The interconnection element of claim 7 further comprising a through-hole appendage positioned at opposite ends of the planar portion.

9. An interconnection element for coupling a component with a circuit board having a top side and a bottom side, the element comprising:
    a planar portion configured to be surface mounted on the top side of the circuit board to overlie an opening in the circuit board;
    an opening formed in the planar portion to coincide with the circuit board opening;
    opposing spring fingers coupled to the planar portion, each spring finger having a gripping leg extending down toward the planar portion and being positioned on opposite sides of the opening in the planar portion;
    the gripping legs extending through the opening in the planar portion to extend into the board opening to capture a component lead that extends in the board opening from the bottom side of the circuit board.

10. The interconnection element of claim 9 wherein each gripping leg includes a flared section that is angled away from the opposing gripping leg so that the opposing legs form a flare area below the planar portion to capture a component lead.

11. The interconnection element of claim 9 further comprising at least one through-hole appendage that extends from the planar portion of the element, the through-hole appendage configured to engage a through-hole in a circuit board when the planar portion is surface mounted to the top side of the board.

12. An interconnection element for coupling a component with a circuit board having a top side and a bottom side, the element comprising:
    a planar portion configured to be surface mounted on a flat surface of the top side of the circuit board, the planar portion including an opening formed therein;

opposing spring fingers coupled to the planar portion, each spring finger having a gripping leg extending down toward the planar portion and being positioned on opposite sides of the planar portion;

the gripping legs extending through the opening in the planar portion to extend into an opening formed in the circuit board to capture a component lead that extends in the circuit board opening from the bottom side of the circuit board;

at least one through-hole appendage coupled with the planar portion of the element, the through-hole appendage configured to engage a through-hole formed in a circuit board when the planar portion is surface mounted to the top side of the board.

13. The interconnection element of claim 12 wherein each gripping leg includes a flared section that is angled away from the opposing gripping leg so that the opposing legs form a flare area to capture a component lead.

14. The interconnection element of claim 12 further comprising a plurality of through-hole appendages coupled with the planar portion.

15. The interconnection element of claim 12 further comprising a through-hole appendage positioned at opposite ends of the planar portion.

16. A method of coupling a component with a circuit board having a top side and a bottom side, the method comprising:
   mounting at least one component on the top side of a circuit board;
   the circuit board including at least one opening therein extending between the top side and bottom side;
   mounting an interconnection element to the top side of the board to overlie the opening in the circuit board, the interconnection element including a planar portion that is surface mounted on the top side of the circuit board and an opening formed in the planar portion to coincide with the circuit board opening;
   the interconnection element including opposing spring fingers coupled to the planar portion on opposite sides of the planar portion opening, each spring finger having a gripping leg extending through the opening in the planar portion;
   positioning the interconnection element so the gripping legs extend into the board opening from the top side of the board;
   mounting at least one component, having a lead, on the bottom side of the board and positioning the component lead to extend into the board opening from the bottom side so that it is captured by the gripping legs that extend into the board opening.

17. The method of claim 16 wherein the gripping legs of the spring fingers each define an axis, the gripping legs being oriented so that the axes intersect each other at a point below the board top side.

18. The method of claim 16 wherein each gripping leg includes a flared section that is angled away from the opposing gripping leg so that the opposing legs form a flare area that is at least partially below the planar portion.

19. The method of claim 16 further comprising:
   positioning a through-hole in the circuit board adjacent to the circuit board opening;
   directing at least one through-hole appendage coupled to the planar portion of the interconnection element into the through-hole in the circuit board and mounting the appendage in the through-hole when the planar portion is surface mounted to the top side of the board.

20. A method of coupling a component with a circuit board having a top side and a bottom side, the method comprising:
   mounting at least one component on the top side of a circuit board;
   the circuit board including at least one lead opening therein extending between the top side and bottom side and including a through-hole in the circuit board adjacent to the circuit board lead opening;
   mounting an interconnection element to the top side of the board to overlie the lead opening in the circuit board, the interconnection element including a planar portion and an opening formed in the planar portion;
   the interconnection element being surface mounted so the planar portion opening coincides with the circuit board lead opening;
   directing at least one through-hole appendage coupled to the planar portion into the through-hole in the circuit board and mounting the appendage in the through-hole when the planar portion is surface mounted to the top side of the board;
   the interconnection element including opposing spring fingers configured to grip a component lead, wherein the opposing spring fingers extend through the opening in the planar portion and extend into the circuit board lead opening from the top side of the board;
   mounting at least one component, having a lead, on the bottom side of the board and positioning the component lead to extend into the circuit board lead opening from the bottom side so that it is captured by the spring fingers.

21. The method of claim 20 wherein the circuit board includes a plurality of through-holes in the circuit board adjacent to the circuit board lead opening, the method further comprising directing a plurality of through-hole appendages coupled with the planar portion into the through-holes and mounting the appendages in the through-holes.

22. A method of coupling a component with a circuit board having a top side and a bottom side, the method comprising:
   mounting at least one component on the top side of a circuit board;
   the circuit board including at least one lead opening therein extending between the top side and bottom side and including a through-hole in the circuit board adjacent to the circuit board lead opening;
   positioning a solder pattern around the lead opening and the through-hole in the circuit board;
   mounting an interconnection element to the top side of the board to overlie the lead opening in the circuit board, the interconnection element including a planar portion and an opening formed in the planar portion;
   the interconnection element being surface mounted to engage the solder pattern so the planar portion opening coincides with the circuit board lead opening;
   directing at least one through-hole appendage coupled to the planar portion into the through-hole in the circuit board and mounting the appendage in the through-hole when the planar portion is surface mounted to the top side of the board;
   the interconnection element including opposing spring fingers configured to grip a component lead;
   mounting at least one component, having a lead, on the bottom side of the board and positioning the component lead to extend into the circuit board lead opening from the bottom side so that it is captured by the spring fingers.

* * * * *